(12) United States Patent
Miyahara

(10) Patent No.: US 10,225,924 B2
(45) Date of Patent: Mar. 5, 2019

(54) ELECTRONIC COMPONENT

(71) Applicant: Murata Manufacturing Co., Ltd., Nagaokakyo-shi, Kyoto-fu (JP)

(72) Inventor: Kunihiro Miyahara, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/859,784

(22) Filed: Jan. 2, 2018

(65) Prior Publication Data

US 2018/0199427 A1 Jul. 12, 2018

(30) Foreign Application Priority Data

Jan. 12, 2017 (JP) ................................ 2017-003279

(51) Int. Cl.
| | |
|---|---|
| *H05K 9/00* | (2006.01) |
| *H05K 1/02* | (2006.01) |
| *H05K 1/11* | (2006.01) |
| *H01G 4/20* | (2006.01) |
| *H03H 7/01* | (2006.01) |

(52) U.S. Cl.
CPC ............. *H05K 1/0218* (2013.01); *H01G 4/20* (2013.01); *H05K 1/0224* (2013.01); *H05K 1/0269* (2013.01); *H05K 1/115* (2013.01); *H05K 9/00* (2013.01); *H05K 9/0049* (2013.01); *H03H 7/0153* (2013.01); *H05K 2201/0195* (2013.01); *H05K 2201/0715* (2013.01); *H05K 2201/09936* (2013.01)

(58) Field of Classification Search
CPC ........ H05K 9/0064; H05K 9/0049; H01G 4/20
See application file for complete search history.

(56) References Cited

U.S. PATENT DOCUMENTS

2015/0302990 A1* 10/2015 Ghosh .................. H01G 4/33
428/141

FOREIGN PATENT DOCUMENTS

JP          9-121093 A      5/1997

* cited by examiner

*Primary Examiner* — Hung V Ngo
(74) *Attorney, Agent, or Firm* — Keating & Bennett, LLP

(57) ABSTRACT

An electronic component includes dielectric layers laminated along a lamination direction and shield electrodes. The dielectric layers include first and second dielectric layers. The side surfaces of the first dielectric layer are not covered with the shield electrodes. The side surfaces of the second dielectric layer are covered with the shield electrodes. The dielectric constant of the first dielectric layer is lower than the second dielectric constant of the dielectric layer.

6 Claims, 6 Drawing Sheets

ELECTRONIC COMPONENT

CROSS REFERENCE TO RELATED APPLICATIONS

This application claims the benefit of priority to Japanese Patent Application No. 2017-003279 filed on Jan. 12, 2017. The entire contents of this application are hereby incorporated herein by reference.

BACKGROUND OF THE INVENTION

1. Field of the Invention

The present invention relates to an electronic component including a shield electrode.

2. Description of the Related Art

Electronic components of an integrated circuit are closely arranged on a substrate in many cases. Therefore, when electromagnetic noise generated in the electronic component leaks to the outside, the noise influences other electronic components close to the electronic component in some cases.

In order to prevent such a situation, a shield electrode is provided on the surface of an electronic component in some cases as in a shield-type multilayer electronic component disclosed in Japanese Unexamined Patent Application Publication No. 9-121093.

Electromagnetic noise from the electronic component is guided to a ground electrode with the shield electrode interposed therebetween. The electronic component including the shield electrode can reduce leakage of the electromagnetic noise. The above-described effect of the shield electrode is also referred to as a shield effect, hereinafter.

In terms of reduction of the leakage of the electromagnetic noise, it is desirable that the side surfaces of the electronic component are covered with the shield electrode as much as possible. From the different viewpoint from the suppression of the leakage of the electromagnetic noise, a portion of the surfaces of the electronic component is not intentionally covered with the shield electrode in some cases. For example, when the shield electrode makes contact with input and output terminals of the electronic component, the input and output terminals short-circuit with the ground electrode with the shield electrode interposed therebetween. In this case, it becomes difficult to transfer signals between the electronic component and an external apparatus and there arises a risk that the electronic component does not function. In order to prevent such a situation, no shield electrode is provided on portions of the side surfaces, which are close to the input and output terminals, in some cases as in the shield-type multilayer electronic component disclosed in Japanese Unexamined Patent Application Publication No. 9-121093. The electromagnetic noise is easy to leak from the portions on which no shield electrode is provided.

SUMMARY OF THE INVENTION

Preferred embodiments of the present invention provide electronic components in which leakage of electromagnetic noise from an electronic component is reduced or prevented.

An electronic component according to a preferred embodiment of the present invention includes dielectric layers laminated along a lamination direction and a shield portion. The plurality of dielectric layers include first and second dielectric layers. At least portions of side surfaces of the first dielectric layer along the lamination direction are not covered with the shield portion. Side surfaces of the second dielectric layer along the lamination direction are covered with the shield portion. A dielectric constant of the first dielectric layer is lower than a dielectric constant of the second dielectric layer.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
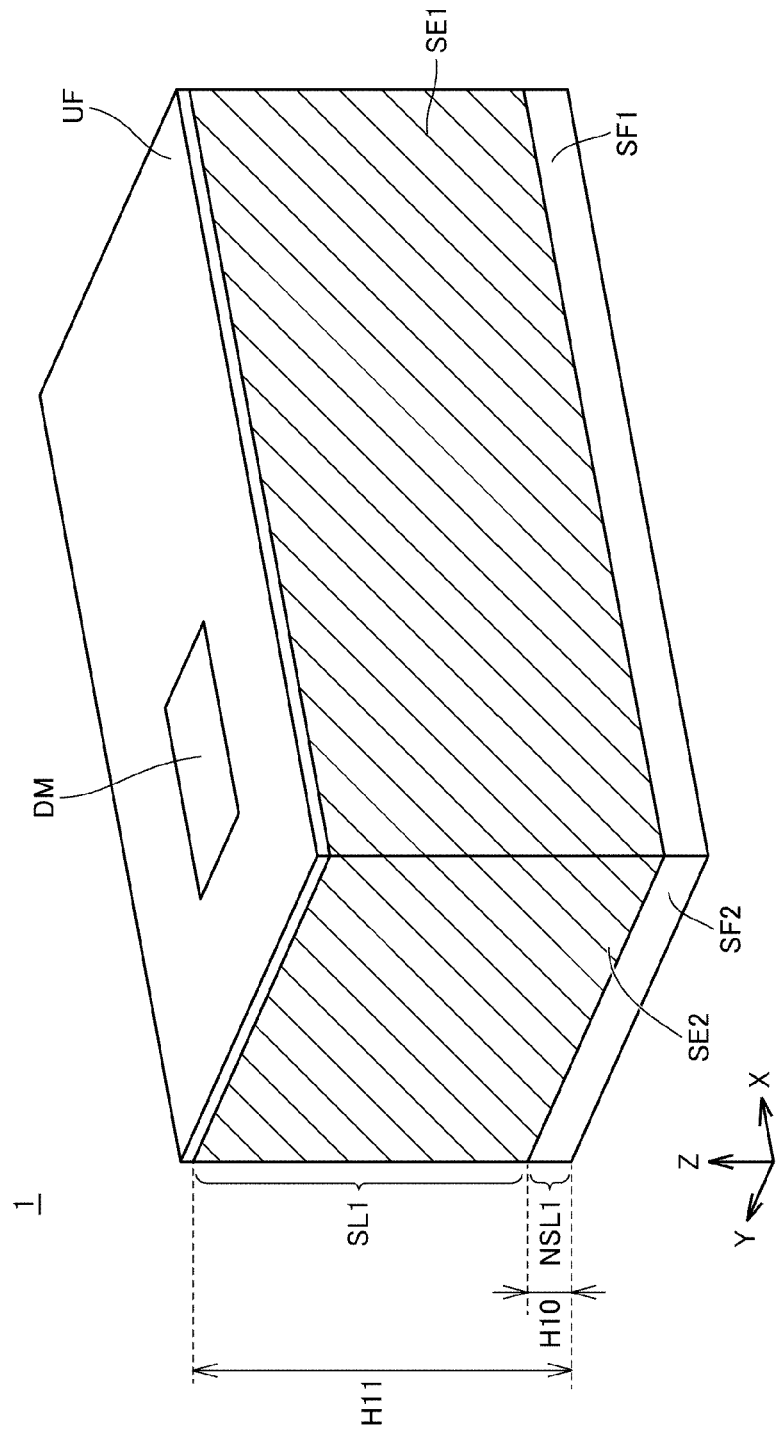
FIG. 1 is a perspective view of an outer appearance of an electronic component according to a first preferred embodiment of the present invention.

Hereinafter, preferred embodiments of the present invention will be described in detail with reference to the drawings. The same reference numerals denote the same or equivalent elements in the drawings and description thereof is not repeated.

First Preferred Embodiment

Figure 2:
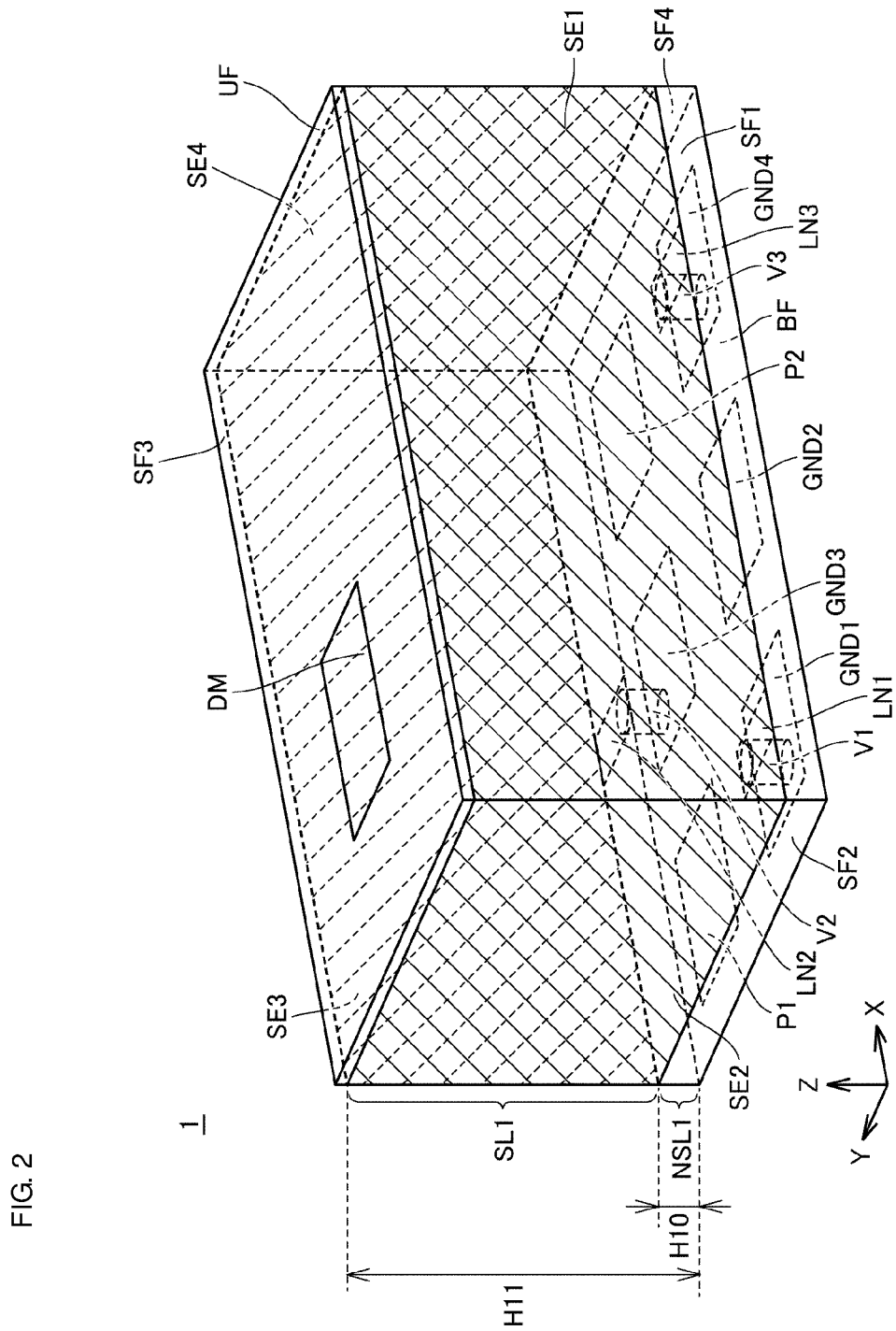
FIG. 2 is a see-through view of the outer appearance of the electronic component in FIG. 1.

FIG. 1 is a perspective view of an outer appearance of an electronic component 1 according to a first preferred embodiment of the present invention. The electronic component 1 is preferably, for example, a low pass filter, a high pass filter, or a band pass filter. FIG. 2 is a see-through view of the outer appearance of the electronic component 1 in FIG. 1. FIG. 2 does not illustrate a circuit pattern that is provided in the electronic component 1 and is a generation source of electromagnetic noise in order to facilitate description of the electronic component 1. The electronic component 1 is a multilayer body in which a plurality of dielectric layers are laminated in a Z-axis direction (lamination direction).

As illustrated in FIG. 1 and FIG. 2, the electronic component 1 preferably has, for example, a rectangular or substantially rectangular parallelepiped shape. Outermost surfaces of the electronic component 1, which are perpendicular or substantially perpendicular to the lamination direction, are a bottom surface BF and an upper surface UF. Surfaces in parallel or substantially in parallel with a ZX plane among surfaces in parallel or substantially in parallel with the lamination direction are side surfaces SF1 and SF3. Surfaces in parallel or substantially in parallel with a YZ plane among the surfaces in parallel or substantially in parallel with the lamination direction are side surfaces SF2 and SF4.

A direction identification mark DM is provided on the upper surface UF. The direction identification mark DM identifies a direction of the electronic component 1 in mounting.

Input and output terminals P1 and P2 connected to the circuit pattern and ground electrodes GND1 to GND4 are arranged on the bottom surface BF. The input and output terminals P1 and P2 and the ground electrodes GND1 to GND4 are preferably, for example, LGA (Land Grid Array) terminals defined by regularly arranging planar electrodes on the bottom surface BF. The bottom surface BF is connected to a circuit substrate (not illustrated).

Side surface shield electrodes SE1 to SE4 are respectively arranged on the side surfaces SF1 to SF4. In order to reliably prevent contact between the side surface shield electrodes SE1 to SE4 and the input and output terminals P1 and P2 in a manufacturing process of the electronic component 1, the side surfaces of the dielectric layers (non-shielded layer NSL1) from the bottom surface BF to a level at a top of distance (hereinafter, also simply referred to as "height") H10 in the lamination direction are not covered with the side surface shield electrodes SE1 to SE4. On the other hand, in order to reduce or prevent leakage of electromagnetic noise from the electronic component 1, the side surfaces of the dielectric layers (shielded layer SL1) from the top of the height H10 to a top of the height H11 (>H10) are covered with the side surface shield electrodes SE1 to SE4. The circuit pattern is arranged in the dielectric layers (non-shielded layer NSL1 and the shielded layer SL1) from the bottom surface BF to the top of the height H11. The side surface shield electrodes SE1 to SE4 define a shield portion.

The side surface shield electrode SE1 is connected to the ground electrode GND1 with a line conductor pattern LN1 and a via conductor pattern V1 provided in the electronic component 1 interposed therebetween. The side surface shield electrode SE2 is connected to the side surface shield electrode SE1. The side surface shield electrode SE3 is connected to the side surface shield electrode SE2. The side surface shield electrode SE3 is connected to the ground electrode GND3 with a line conductor pattern LN2 and a via conductor pattern V2 provided in the electronic component 1 interposed therebetween. The side surface shield electrode SE4 is connected to the side surface shield electrodes SE1 and SE3.

The circuit pattern as the generation source of the electromagnetic noise is not disposed between the shielded layer SL1 and the upper surface UF. Leakage of the electromagnetic noise from the side surfaces of the dielectric layers disposed between the shielded layer SL1 and the upper surface UF is reduced in comparison to the case in which the circuit pattern is disposed between the shielded layer SL1 and the upper surface UF. In the first preferred embodiment, the necessity for coverage of the side surfaces of the dielectric layers which are between the shielded layer SL1 and the upper surface UF with the side surface shield electrodes SE1 to SE4 is low. Therefore, the side surfaces of the above-described dielectric layers are not covered with the side surface shield electrodes SE1 to SE4.

When the side surfaces of the dielectric layers between the bottom surface BF and the shielded layer SL1 are not covered with the shield electrodes, it is difficult to cover the side surfaces of the dielectric layers between the shielded layer SL1 and the upper surface UF in some cases for manufacturing reasons. In this case, it is also assumed that even when the circuit pattern is disposed between the shielded layer SL1 and the upper surface UF, the side surfaces of the dielectric layers which are between the shielded layer SL1 and the upper surface UF are not covered with the side surface shield electrodes SE1 to SE4 for manufacturing reasons.

In terms of reducing or preventing leakage of the electromagnetic noise from the electronic component 1, it is preferable that the side surfaces of the electronic component 1 are covered with the shield electrodes as much as possible. However, in the electronic component 1, the side surface shield electrodes SE1 to SE4 are not provided on the side surfaces of the dielectric layers (non-shielded layer NSL1) including the bottom surface BF in order to prevent contact between the input and output terminals P1 and P2 provided on the bottom surface and the side surface shield electrodes SE1 to SE4. The electromagnetic noise from the circuit pattern is not shielded by the side surface shield electrodes SE1 to SE4 on the side surfaces of the non-shielded layer NSL1.

For dealing with this, in the electronic component 1, preferably, the dielectric constants of the dielectric layers including the side surfaces at least portions of which are not covered with the shield electrodes, such as the dielectric layers included in the non-shielded layer NSL1 are set to be lower than the dielectric constants of the dielectric layers including the side surfaces which are covered with the shield electrodes, such as the dielectric layers included in the shielded layer SL1.

When the wave length of electromagnetic noise under vacuum is λ and the dielectric constant of a certain dielectric layer is ε1, the wave length λ1 of electromagnetic noise in the dielectric layer is expressed by the following equation (1).

$$\lambda 1 = \frac{\lambda}{\sqrt{\varepsilon 1}} \tag{1}$$

As is clear from the equation (1), as the dielectric constant of the dielectric layer is lower, the wave length of the electromagnetic noise in the dielectric layer is increased. The dielectric constant of the non-shielded layer NSL1 is preferably lower than the dielectric constant of the shielded layer SL1. Therefore, the wave length of electromagnetic noise in the non-shielded layer NSL1 is larger than the wave length of electromagnetic noise in the shielded layer SL1. The electromagnetic noise is difficult to leak from the non-shielded layer. As a result, the leakage of the electromagnetic noise from the electronic component 1 is able to be reduced or prevented.

Figure 3A:
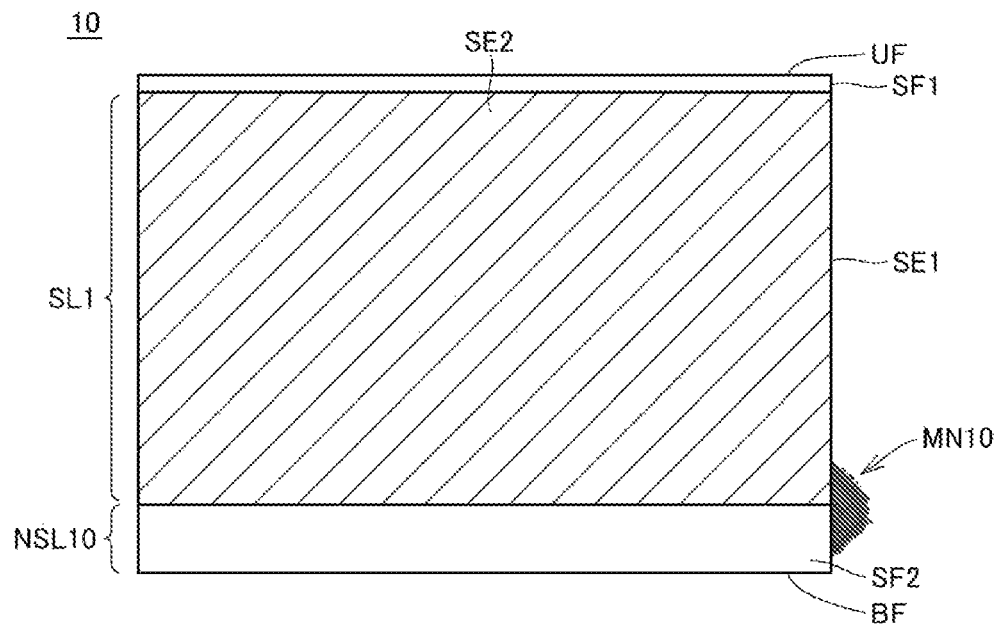
FIG. 3A is a view illustrating a simulation result of electromagnetic noise that leaks from an electronic component according to a comparative example and FIG. 3B is a view illustrating a simulation result of electromagnetic noise that leaks from the electronic component illustrated in FIG. 1.
Figure 3B:
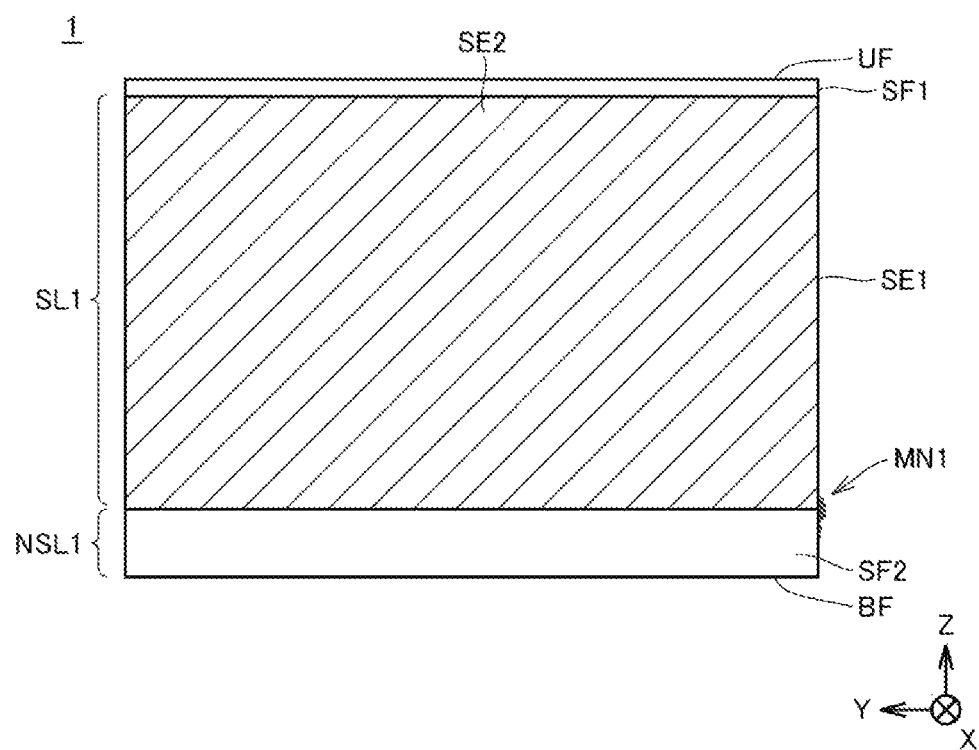

FIG. 3A is a view illustrating a simulation result of electromagnetic noise that leaks from an electronic component 10 according to a comparative example and FIG. 3B is a view illustrating a simulation result of the electromagnetic noise that leaks from the electronic component 1 illustrated in FIG. 1. The electronic component 10 is different from the electronic component 1 in that the dielectric constant of the shielded layer SL1 and the dielectric constant of a non-shielded layer NSL10 are the same. The electronic component 10 and the electronic component 1 have the same or substantially the same configuration other than the configuration of the dielectric constant of the non-shielded layer. FIGS. 3A and 3B are plan views when the respective side surfaces SF2 of the electronic component 10 and the electronic component 1 are seen from an X-axis direction and illustrate the simulation results of the electromagnetic noises that leak from the side surfaces SF1.

As FIGS. 3A and 3B are compared, the side surface shield electrodes SE1 shield the electromagnetic noises and, therefore, the electromagnetic noises do not significantly leak from the shielded layers SL1. On the other hand, electromagnetic noises MN10 and MN1 leak from portions with boundary portions being centered between the shielded layers SL1 and the non-shielded layers NSL10 (NSL1). As the electromagnetic noise MN10 and the electromagnetic noise MN1 are compared, the electromagnetic noise MN1 is smaller. The electronic component 1 reduces or prevents the leakage of the electromagnetic noise so as to be smaller than that in the electronic component 10.

As described above, with the electronic component according to the first preferred embodiment, the leakage of the electromagnetic noise from the electronic component is able to be reduced or prevented by setting the dielectric constants of the dielectric layers included in the non-shielded layer to be lower than the dielectric constants thereof included in the shielded layer.

Second Preferred Embodiment

In the first preferred embodiment, the case in which the side surface shield electrodes are connected to the ground electrodes with the conductors provided in the electronic component interposed therebetween has been described. It is sufficient that the side surface shield electrodes and the ground electrodes are electrically connected. In a second preferred embodiment, a case in which the side surface shield electrodes and the ground electrodes are directly connected will be described.

Figure 4:
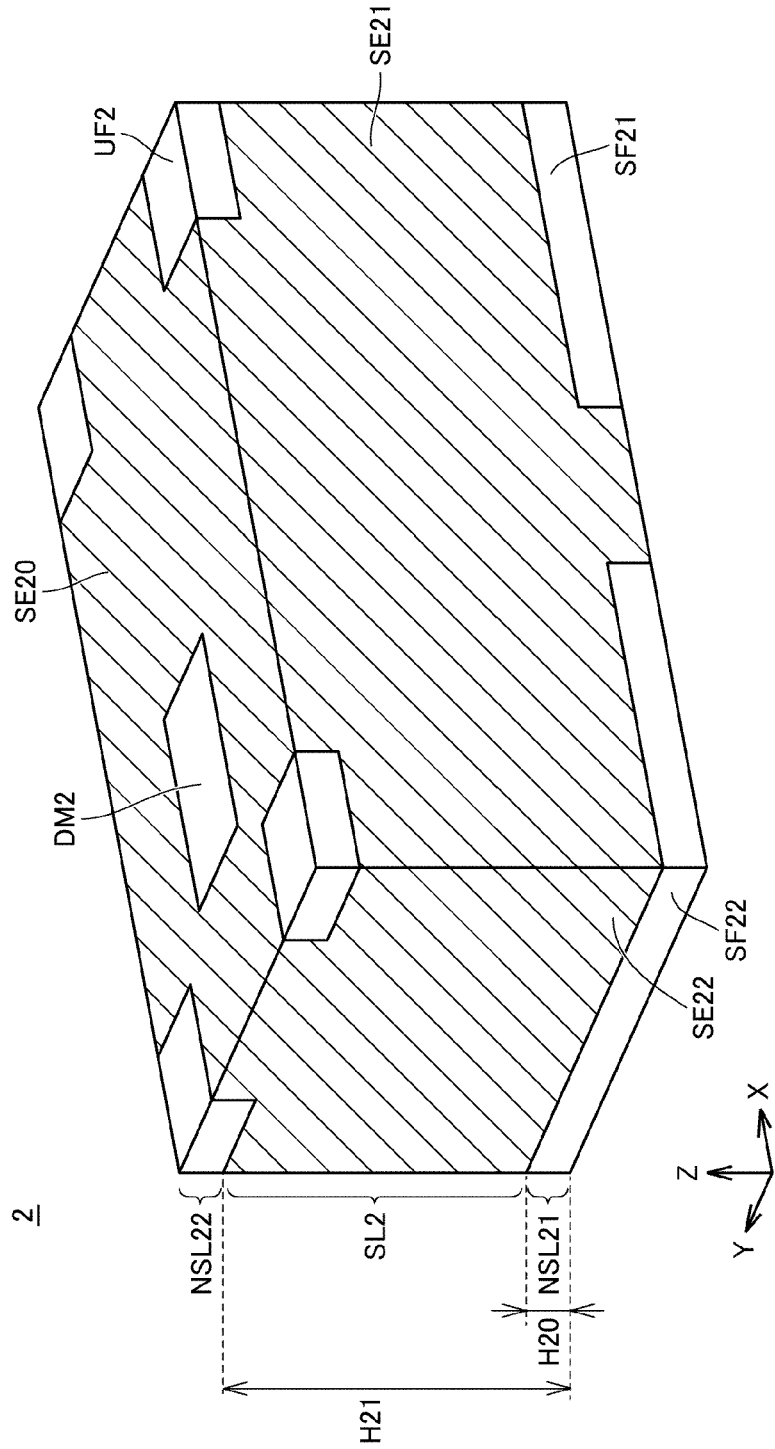
FIG. 4 is a perspective view of an outer appearance of an electronic component according to a second preferred embodiment of the present invention.
Figure 5:
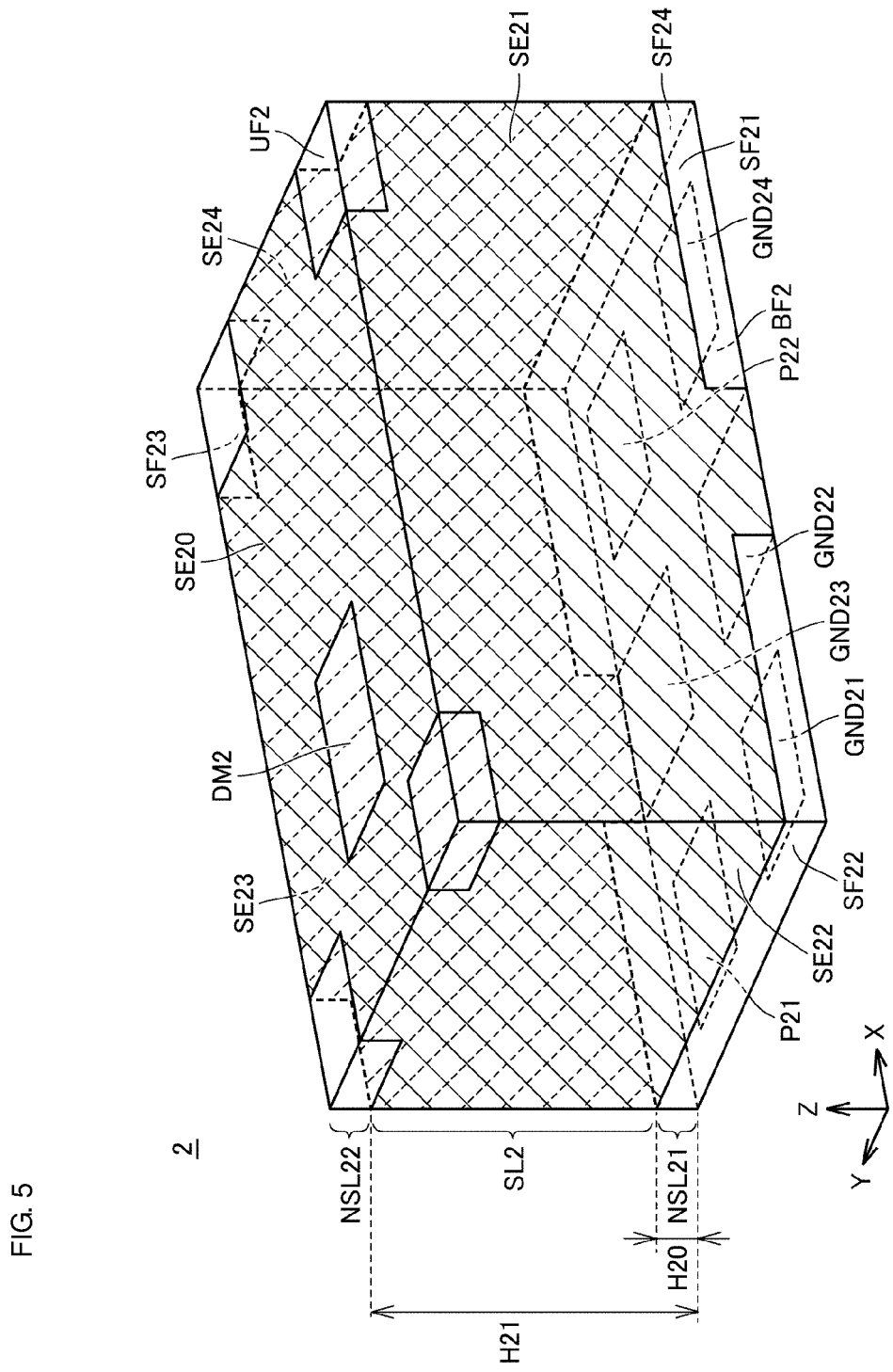
FIG. 5 is a see-through view of the outer appearance of the electronic component in FIG. 4.

FIG. 4 is a perspective view of an outer appearance of an electronic component 2 according to the second preferred embodiment. FIG. 5 is a see-through view of the outer appearance of the electronic component 2 in FIG. 4. FIG. 5 also does not illustrate a circuit pattern that is provided in the electronic component 2 in order to facilitate illustration and description of the electronic component 2. The electronic component 2 is a multilayer body in which a plurality of dielectric layers are laminated in a Z-axis direction.

As illustrated in FIG. 4 and FIG. 5, the electronic component 2 preferably has, for example, a rectangular or substantially rectangular parallelepiped shape. Outermost surfaces of the electronic component 2, which are perpendicular or substantially perpendicular to the lamination direction, are a bottom surface BF2 and an upper surface UF2. Surfaces in parallel or substantially in parallel with a ZX plane among surfaces in parallel or substantially in parallel with the lamination direction are side surfaces SF21 and SF23. Surfaces in parallel or substantially in parallel with a YZ plane among the surfaces in parallel or substantially in parallel with the lamination direction are side surfaces SF22 and SF24.

An upper surface shield electrode SE20 and a direction identification mark DM2 are provided on the upper surface UF2. The direction identification mark DM2 identifies a direction of the electronic component 2 in mounting.

In the electronic component 2, portions of the upper surface UF2 in the vicinity of respective vertices are not covered by the upper surface shield electrode SE20. The portions of the surface of the electronic component 2 are preferably not covered with the shield electrode as described above in order to, for example, provide the shield effect and a Q value in an appropriately balanced manner. When the circuit pattern includes an inductor, if a magnetic flux from the inductor is shielded by the shield electrode, eddy current is generated in the shield electrode. The generation of the eddy current increases insertion loss of the electronic component 2 and deteriorates the Q value. In order to provide the shield effect and the Q value in the appropriately balanced manner, a case in which the portions of the surface of the electronic component 2 are not intentionally covered is described.

Input and output terminals P21 and P22 and ground electrodes GND21 to GND24 are arranged on the bottom surface BF2. The input and output terminals P21 and P22 and the ground electrodes GND21 to GND24 are preferably, for example, LGA (Land Grid Array) terminals provided by regularly arranging planar electrodes on the bottom surface BF2. The bottom surface BF2 is connected to a circuit substrate (not illustrated).

Side surface shield electrodes SE21 to SE24 are respectively provided on side surfaces SF21 to SF24. In order to reliably prevent contact between the side surface shield electrodes SE21 to SE24 and the input and output terminals P21 and P22 in a manufacturing process of the electronic component 2, only connection portions between the side surface shield electrodes SE21 and SE23 and the ground electrodes GND22 and GND23 on the side surfaces of the dielectric layers (non-shielded layer NSL21) from the bottom surface BF2 to a top of the height H20 are covered with the side surface shield electrodes SE21 and SE23. Portions other than the connection portions on the side surfaces of the non-shielded layer NSL21 are not covered with the side surface shield electrodes SE21 to SE24. The non-shielded layer NSL21 includes the bottom surface BF2.

In the same or substantially the same manner as the upper surface shield electrode SE20, portions of the side surfaces of the dielectric layers (non-shielded layer NSL22) from a top of the height H21 (>H20) to the upper surface UF2 in the vicinity of the respective vertices included in the upper surface UF2 are not covered with the side surface shield electrodes SE21 to SE24. The non-shielded layer NSL22 includes the upper surface UF2.

In order to reduce or prevent leakage of electromagnetic noise from the electronic component 2, the side surfaces of the dielectric layers (shielded layer SL2) from the top of the height H20 to the top of the height H21 are covered with the side surface shield electrodes SE21 to SE24. The side surface shield electrodes SE21 to SE24 define a shield portion in the present preferred embodiment. The shielded layer SL2 is arranged between the non-shielded layers NSL21 and NSL22.

The upper surface shield electrode SE20 is connected to the side surface shield electrodes SE21 to SE24. The side surface shield electrode SE21 is directly connected to the ground electrode GND22. The side surface shield electrode SE22 is connected to the side surface shield electrode SE21. The side surface shield electrode SE23 is connected to the side surface shield electrode SE22. The side surface shield electrode SE23 is directly connected to the ground electrode GND23. The side surface shield electrode SE24 is connected to the side surface shield electrodes E21 and E23.

In the electronic component 2, the dielectric constants of the non-shielded layers NSL21 and NSL22 are lower than the dielectric constant of the shielded layer SL2. Therefore, the wave lengths of electromagnetic noises in the non-shielded layers NSL21 and NSL22 are larger than the wave length of electromagnetic noise in the shielded layer SL2. The electromagnetic noise does not significantly leak from the non-shielded layers NSL21 and NSL22. As a result, leakage of the electromagnetic noise from the electronic component 2 is able to be reduced or prevented.

In the electronic component 2, the non-shielded layers NSL21 and NSL22 preferably respectively include a lowermost layer (dielectric layer including the bottom surface BF2) and an uppermost layer (dielectric layer including the upper surface UF2) among the plurality of dielectric layers. The non-shielded layer of the electronic component according to preferred embodiments of the present invention is not necessarily required to include the uppermost layer or the lowermost layer among the plurality of dielectric layers. The non-shielded layer of the electronic component according to preferred embodiments of the present invention may be arranged between the uppermost layer and the lowermost layer among the plurality of dielectric layers in accordance with the configuration or desired characteristics of the electronic component.

Figure 6:
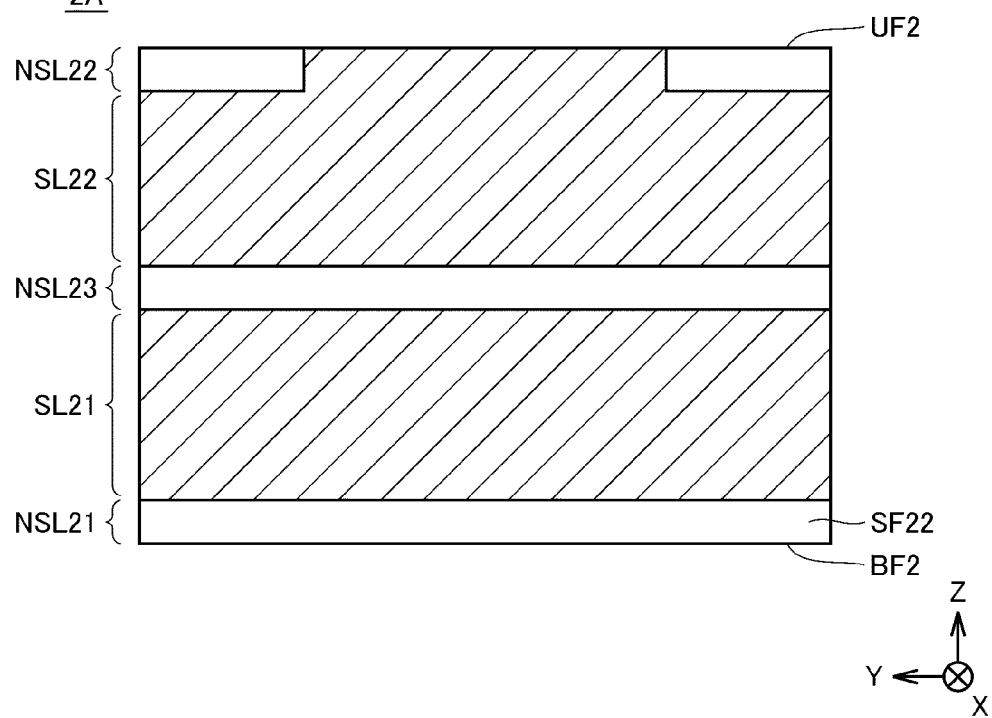
FIG. 6 is a plan view of an electronic component according to a variation of the second preferred embodiment of the present invention.

FIG. 6 is a plan view of an electronic component 2A according to a variation of the second preferred embodiment. As illustrated in FIG. 6, in the electronic component 2A, a shielded layer is divided into two layers SL21 and SL22 and a non-shielded layer NSL23 is provided between the shielded layers SL21 and SL22.

As described above, with the electronic components according to the second preferred embodiment and the variation thereon, leakage of electromagnetic noise from the electronic components is able to be reduced or prevented as in the first preferred embodiment.

The respective preferred embodiments disclosed herein are intended to be implemented while being appropriately combined within a consistent range. It should be considered that the preferred embodiments disclosed herein are exemplary and are non-limiting in all points. The scope of the present invention is defined not by the above description but by the scope of the invention and encompasses all changes within equivalent meanings and ranges to those of the scope of the invention.

In the electronic components according to preferred embodiments of the present invention, the dielectric constant of the first dielectric layer including the side surfaces which are not covered with the shield portion is lower than the dielectric constant of the second dielectric layer having the side surfaces which are covered with the shield portion. The wave length of electromagnetic noise in the first dielectric layer is larger than the wave length of electromagnetic noise in the second dielectric layer.

Therefore, the electromagnetic noise does not significantly leak from the first dielectric layer. As a result, leakage of the electromagnetic noise from the electronic component is able to be suppressed.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
   a plurality of dielectric layers that are laminated along a lamination direction and include first and second dielectric layers; and
   a shield portion; wherein
   at least a portion of side surfaces of the first dielectric layer along the lamination direction is not covered with the shield portion;
   whole side surfaces of the second dielectric layer from a first height to a second height along the lamination direction are covered with the shield portion; and
   a dielectric constant of the first dielectric layer is lower than a dielectric constant of the second dielectric layer.

2. The electronic component according to claim 1, further comprising:
   a ground electrode provided on the first dielectric layer; wherein
   the shield portion is electrically connected to the ground electrode.

3. The electronic component according to claim 2, further comprising:
   a line conductor pattern that is provided in the plurality of dielectric layers and is connected to the shield portion; and
   a via conductor pattern that connects the ground electrode and the line conductor pattern.

4. The electronic component according to claim 2, wherein the shield portion is directly connected to the ground electrode.

5. The electronic component according to claim 1, wherein
   the plurality of dielectric layers further include a third dielectric layer;
   at least a portion of side surfaces of the third dielectric layer along the lamination direction is not covered with the shield portion;
   a dielectric constant of the third dielectric constant is lower than the dielectric constant of the second dielectric layer; and
   the second dielectric layer is provided between the first dielectric layer and the third dielectric layer.

6. The electronic component according to claim 5, wherein
   the electronic component includes first and second surfaces that are orthogonal or substantially orthogonal to the lamination direction;
   the first dielectric layer includes the first surface; and
   the third dielectric layer includes the second surface.

* * * * *